(12) United States Patent
Hozawa et al.

(10) Patent No.: US 11,417,702 B2
(45) Date of Patent: Aug. 16, 2022

(54) SEMICONDUCTOR DETECTOR AND METHOD OF MANUFACTURING THE SAME

(71) Applicant: Hitachi, Ltd., Tokyo (JP)

(72) Inventors: Kazuyuki Hozawa, Tokyo (JP); Taiichi Takezaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/206,566

(22) Filed: Mar. 19, 2021

(65) Prior Publication Data

US 2021/0375978 A1 Dec. 2, 2021

(30) Foreign Application Priority Data

May 28, 2020 (JP) .............................. JP2020-093018

(51) Int. Cl.
*G01T 1/24* (2006.01)
*H01L 27/146* (2006.01)

(52) U.S. Cl.
CPC ........ *H01L 27/14661* (2013.01); *G01T 1/247* (2013.01); *H01L 27/1469* (2013.01); *H01L 27/14636* (2013.01)

(58) Field of Classification Search
CPC ......... H01L 27/14661; H01L 27/14636; H01L 27/1469; H01L 24/16; H01L 24/06; H01L 24/13; H01L 24/14; H01L 24/17; H01L 24/73; H01L 24/83; H01L 24/92; H01L 25/0657; H01L 24/05; H01L 24/29; H01L 24/48; H01L 24/81; H01L 2224/0401; H01L 2224/05552; H01L 2224/05553; H01L 2224/05554; H01L 2224/06051; H01L 2224/0615; H01L 2224/0616; H01L 2224/13014; H01L 2224/13015; H01L 2224/14051; H01L 2224/1415; H01L 2224/1416; H01L 2224/16145; H01L 2224/16227; H01L 2224/17106; H01L 2224/26145; H01L 2224/29011; H01L 2224/32014; H01L 2224/32105;
(Continued)

(56) References Cited

U.S. PATENT DOCUMENTS

2002/0066528 A1* 6/2002 Oxman ............... C08F 290/067
156/309.3
2004/0118599 A1 6/2004 Chason et al.
(Continued)

FOREIGN PATENT DOCUMENTS

EP 0510707 A2 * 4/1992
EP 1200533 A1 5/2002
JP 2019190934 A 10/2019

OTHER PUBLICATIONS

Search Report dated Sep. 9, 2021 in European Application No. 21162735.1.

*Primary Examiner* — Kiho Kim
(74) *Attorney, Agent, or Firm* — Miles & Stockbridge, P.C.

(57) ABSTRACT

A technique capable of improving a performance of a semiconductor detector is provided. The semiconductor detector is made based on injection of an underfill into a gap between a first semiconductor chip and a second semiconductor chip in a flip-chip connection state, but the underfill is not formed in periphery of a connection structure connecting a reading electrode pad and a gate terminal through a bump electrode.

11 Claims, 13 Drawing Sheets

(58) Field of Classification Search
CPC . H01L 2224/32106; H01L 2224/32145; H01L 2224/32167; H01L 2224/32225; H01L 2224/48227; H01L 2224/73203; H01L 2224/73204; H01L 2224/73257; H01L 2224/83104; H01L 2224/92125; H01L 2225/0651; H01L 2225/06513; H01L 2924/15153; H01L 2924/30105; H01L 21/563; H01L 24/32; G01T 1/247; G01T 1/242

See application file for complete search history.

(56) References Cited

U.S. PATENT DOCUMENTS

| | | | |
|---|---|---|---|
| 2005/0167606 A1* | 8/2005 | Harrison | G01T 1/241 250/395 |
| 2009/0290680 A1* | 11/2009 | Turner | G01T 1/247 250/311 |
| 2012/0193545 A1* | 8/2012 | Tkaczyk | G01T 1/2928 250/370.08 |
| 2019/0067037 A1 | 2/2019 | Pelletier et al. | |
| 2019/0324160 A1 | 10/2019 | Hozawa et al. | |

* cited by examiner

FIG. 16

| | WIRE BONDING | UNDERFILL FIXATION | GUIDE PORTION CLOSE TO READING ELECTRODE | GUIDE PORTION CLOSE TO OUTPUT TERMINAL | Mn-Kα HALF WIDTH (eV) |
|---|---|---|---|---|---|
| FIRST RELATED ART | ○ | | | | 130 – 135 |
| SECOND RELATED ART | | ○ | | | 145 – 150 |
| FIRST EMBODIMENT (FIRST SPECIFIC ASPECT) | | ○ | ○ | | 127 – 132 |
| FIRST EMBODIMENT (THIRD SPECIFIC ASPECT) | | ○ | ○ | ○ | 126 – 131 |
| SECOND EMBODIMENT | | | | | 127 – 132 |

SEMICONDUCTOR DETECTOR AND METHOD OF MANUFACTURING THE SAME

CROSS-REFERENCE TO RELATED APPLICATION

The present application claims priority from Japanese Patent Application No. 2020-093018 filed on May 28, 2020, the content of which is hereby incorporated by reference into this application.

TECHNICAL FIELD OF THE INVENTION

The present invention relates to a semiconductor detector and a method of manufacturing the same. For example, the present invention relates to a technique effectively applied to a semiconductor detector measuring energy of electromagnetic wave on the basis of an electric charge amount of electric charge carriers being generated by making incidence of the electromagnetic wave into a depletion layer applied with a drift electric field, the electric charge carriers being moved to and collected in a reading electrode by the drift electric field, and the present invention relates to a method of manufacturing the same.

BACKGROUND OF THE INVENTION

A silicon drift detector is often used for a fluorescent X-ray analyzer because of having higher resolution even in low energy and because not liquid nitrogen but a Peltier element is allowed to be used in cooling and others. In such a silicon drift detector, the electric charge carriers being generated by making the incidence of the electromagnetic wave into the depletion layer are moved to the reading electrode by the drift electric field in a state in which the depletion layer is expanded to the entire semiconductor substrate by application of a reverse bias voltage to a p-n joint portion formed in the semiconductor substrate.

This silicon drift detector includes the reading electrode having an extremely small size, and therefore, has an advantage that is a small electrostatic capacitance (parasitic capacitance) of the reading electrode. Thus, in the silicon drift detector, noises due to the parasitic capacitance are reduced. As a result, the silicon drift detector can measure the electromagnetic wave with the low energy, and can be used for, for example, fluorescent X-ray measurement.

For example, Japanese Patent Application Laid-Open Publication No. 2019-190934 (Patent Document 1) describes a technique related to a silicon drift detector.

SUMMARY OF THE INVENTION

A signal based on the electric charge amount collected to the reading electrode of the silicon drift detector is weak. Therefore, an amplifier is electrically connected to the reading electrode, and an amplified signal is generated by this amplifier from the signal based on the electric charge amount collected to the reading electrode. Then, the electromagnetic wave energy is measured on the basis of the generated amplified signal.

While the silicon drift detector including the reading electrode is formed in a first semiconductor chip, the amplifier is formed in a second semiconductor chip that is different from the first semiconductor chip. The reading electrode formed in the first semiconductor chip and the amplifier formed in the second semiconductor chip are electrically connected to each other by, for example, a wire.

However, when the reading electrode and the amplifier are connected to each other by the wire, the wire necessarily contains a parasitic capacitance and a parasitic inductance. Therefore, the noises due to the parasitic capacitance and the parasitic inductance are superimposed on the signal output from the reading electrode. Particularly, since the signal based on the electric charge amount collected to the reading electrode is weak, even small noises cause adverse influence. Therefore, in order to improve sensitivity of the semiconductor detector including the silicon drift detector and the amplifier to the measurement of the electromagnetic wave energy, an electric connection structure connecting the amplifier and the reading electrode for achieving suppression of the parasitic capacitance and the parasitic inductance is desirable.

An objective of the present invention is to provide a technique capable of improving a performance of a semiconductor detector.

Other object and novel characteristics will be apparent from the description of the present specification and the accompanying drawings.

A semiconductor detector according to an embodiment measures energy of electromagnetic wave on the basis of an electric charge amount of electric charge carriers being generated by making incidence of the electromagnetic wave into a depletion layer applied with a drift electric field, the electric charge carriers being moved to and collected in a reading electrode by the drift electric field. The semiconductor detector includes a first semiconductor chip that has a reading electrode and a reading electrode pad electrically connected to the reading electrode formed therein and a second semiconductor chip that has an amplifier electrically connected to the reading electrode pad and that is connected with the first semiconductor chip in a flip-chip connection state. In this case, an underfill is injected into a gap between the first semiconductor chip and the second semiconductor chip except for a first connection portion connecting the reading electrode pad and the amplifier.

A method of manufacturing a semiconductor detector according to an embodiment includes a step of preparing a first semiconductor chip that has a reading electrode and a reading electrode pad electrically connected to the reading electrode formed therein, a step of preparing a second semiconductor chip that has an amplifier, a step of connecting the first semiconductor chip and the semiconductor chip in a flip-chip connection state so that the reading electrode pad and the amplifier are electrically connected to each other, and a step of injecting an underfill into a gap between the first semiconductor chip and the second semiconductor chip except for a first connection portion connecting the reading electrode pad and the amplifier.

According to an embodiment, a performance of a semiconductor detector can be improved.

BRIEF DESCRIPTIONS OF THE DRAWINGS

FIG. 16 is a diagram for explaining a verification result.

DESCRIPTIONS OF THE PREFERRED EMBODIMENTS

The same components are denoted by the same reference symbols throughout all the drawings for describing the embodiments in principle, and the repetitive description thereof will be omitted. Note that hatching is added even in a planar view in some cases so as to make the drawings easy to see.

First Embodiment

<Configuration of Semiconductor Detector>

Figure 1:
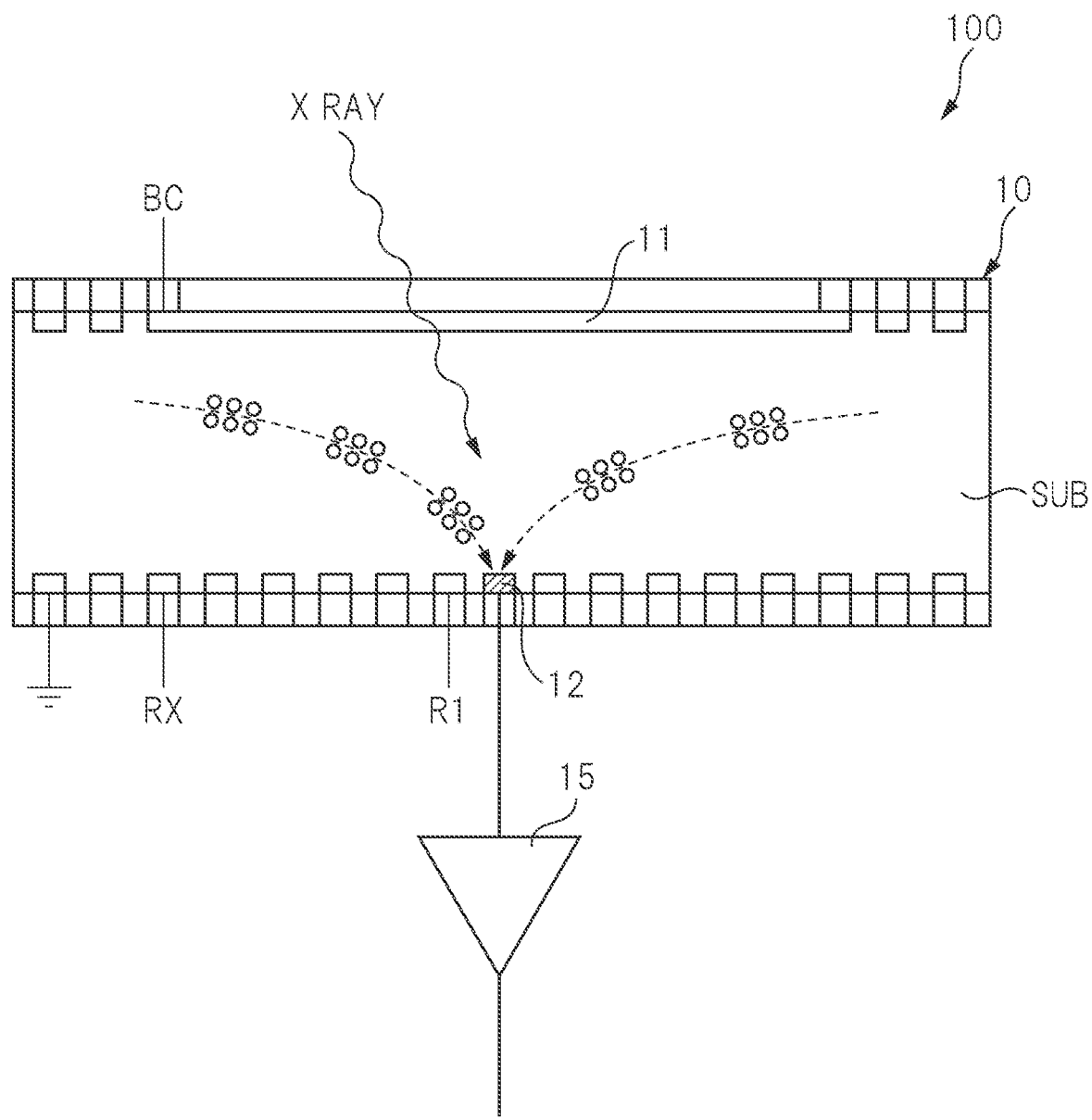
FIG. 1 is a diagram showing a schematic configuration of a semiconductor detector.

FIG. 1 is a diagram showing a schematic configuration of a semiconductor detector.

In FIG. 1, a semiconductor detector 100 includes: a silicon drift detector 10; and an amplifier 15 electrically connected to the silicon drift detector 10.

The silicon drift detector 10 includes a semiconductor substrate SUB made of silicon doped with, for example, an n-type impurity (donor). The semiconductor substrate SUB that is a constituent element of the silicon drift detector 10 has a front surface and a back surface. While the front surface of the semiconductor substrate SUB is called "window surface", the back surface of the semiconductor substrate SUB is called "ring surface".

As shown in FIG. 1, in a region closer to the front surface of the semiconductor substrate SUB, a p-type semiconductor region 11 electrically connected to a back contact BC is formed. In this manner, a p-n junction is formed by the p-type semiconductor region 11 and the semiconductor substrate SUB doped with the n-type impurity. And, a reverse bias voltage is applied to the p-n junction by adjustment of a voltage to be applied to the back contact BC. As a result, the depletion layer extends from the p-n junction, so that the semiconductor substrate SUB is depleted.

Next, as shown in FIG. 1, at the center of the back surface of the semiconductor substrate SUB, a reading electrode 12 made of, for example, an $n^+$-semiconductor region is formed. The reading electrode 12 functions as, for example, an anode electrode. A plurality of ring electrodes are formed so as to concentrically surround the reading electrode 12. The ring electrodes particularly include an internal electrode R1 formed on an inner circumference and an external electrode RX formed on an outer circumference. Different voltages are applied to the internal electrode R1 and the external electrode RX. In this manner, a drift electric field is applied to the depleted semiconductor substrate SUB having the depletion layer.

Subsequently, as shown in FIG. 1, the amplifier 15 is electrically connected to the reading electrode 12. For example, a field effect transistor having a gate electrode, a source and a drain is formed in this amplifier 15, and the gate electrode of the field effect transistor and the reading electrode 12 are electrically connected to each other.

<Operation of Semiconductor Detector>

Next, an operation of the semiconductor detector 100 will be explained.

First, when the X ray (electromagnetic wave) is made incident from a region close to the "window surface" of the silicon drift detector 10 into the semiconductor substrate SUB, the X ray is made incident into the depletion layer existing in the depleted semiconductor substrate SUB. Then, the X ray is absorbed in the depletion layer, so that a pair of electron and positive hole is formed. In other words, since the X-ray energy is larger than a band gap of silicon making the semiconductor substrate SUB, the X-ray energy is used for energy for exciting an electron in a valance band of the silicon to a conduction band of the silicon. As a result, a plurality of electrons are excited to the conduction band in accordance with the X-ray energy. That is, the larger the X-ray energy is, the more the excited electrons (electric charge amount) to the conduction band is. In this case, in the silicon drift detector 10, a potential difference is applied between the internal electrode R1 and the external electrode RX, and therefore, the electron generated in the depletion layer is moved toward the reading electrode 12 by the drift electric field generated by this potential difference. In this manner, the electrons are collected to the reading electrode 12. In this specification, the reading electrode 12 is the anode electrode, and the electron is assumed to be the electric charge carrier collected to the reading electrode 12. The weak signal generated by the electron collected to the reading electrode 12 is amplified by the amplifier 15 electrically connected to the reading electrode 12, and an amplified signal is output from the semiconductor detector 100.

Then, on the basis of the amplified signal that is output from the semiconductor detector 100, the X-ray energy is measured. For example, a magnitude of the amplified signal is proportional to the electric charge amount of the electrons, and the electric charge amount collected to the reading electrode 12 varies depending on the X-ray energy, and therefore, the incident X-ray energy can be measured by analysis of the amplified signal in proportional to the electric charge amount of the electrons.

<Explanation for First Related Art>

The above-described semiconductor detector 100 is configured to be mounted.

First, a first related art to the mount configuration of the semiconductor detector will be explained below.

The "related art" described in the present specification is not a publicly-known technique but a technique having an issue that has been found by the present inventor, and is a premise technique of the invention of the present application.

Figure 2:
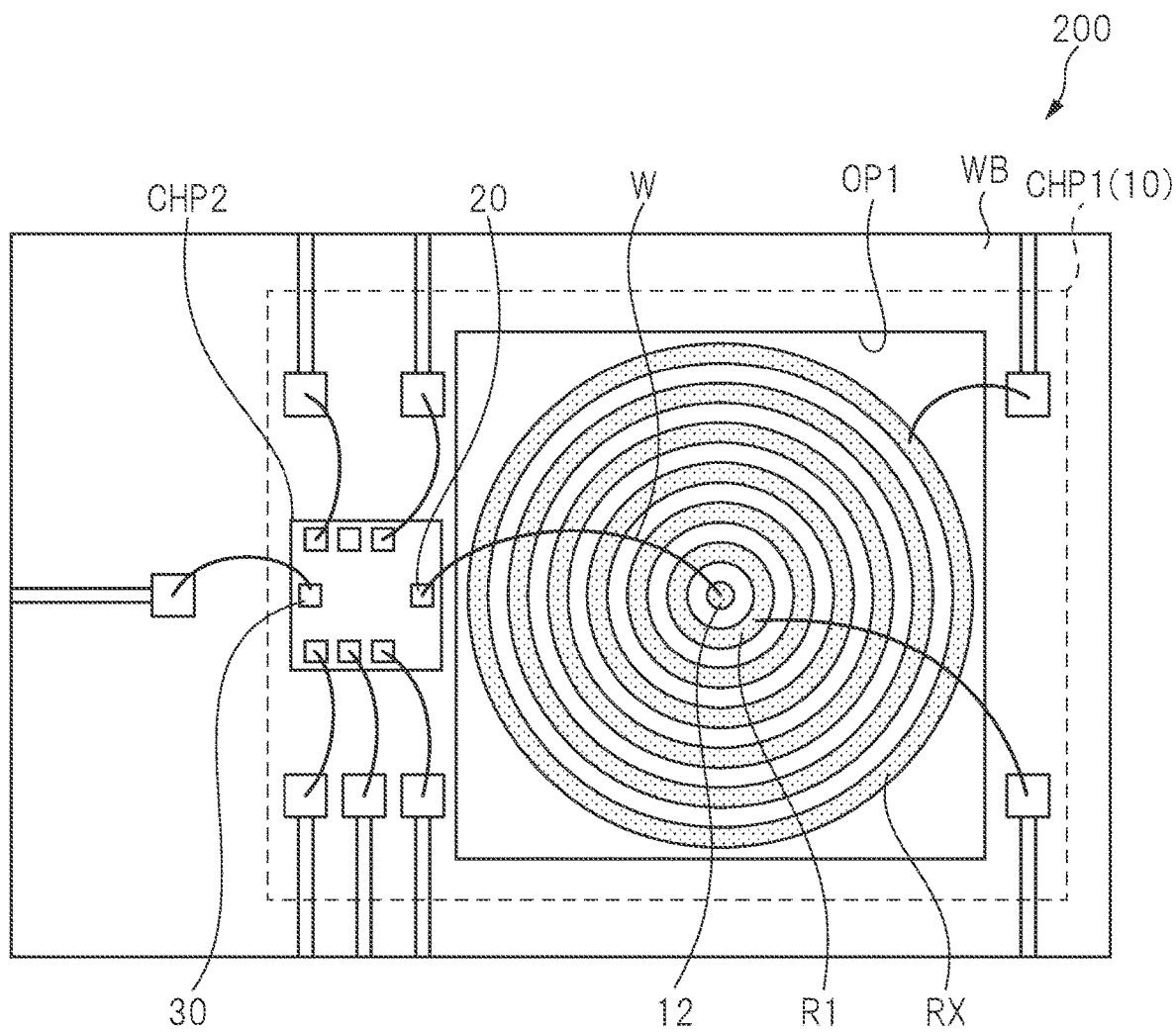
FIG. 2 is a planar view showing a mount configuration of a semiconductor detector according to a first related art.

FIG. 2 is a planar view schematically showing the mount configuration of the semiconductor detector according to the first related art.

In FIG. 2, a semiconductor detector 200 includes a wiring board WB on which a plurality of wirings are formed. FIG. 2 is a planar view in view from a lower surface of the wiring board WB. While a semiconductor chip CHP1 having the silicon drift detector 10 formed therein is mounted on an upper surface of the wiring board WB, a semiconductor chip CHP2 is mounted on a lower surface of the wiring board WB. In FIG. 2, a back surface ("ring surface") of the semiconductor chip CHP1 mounted on the upper surface of the wiring board WB is visible through an opening OP1 formed in the wiring board WB.

The silicon drift detector 10 formed in the semiconductor chip CHP1 includes the reading electrode 12. On the other hand, the amplifier is formed in the semiconductor chip CHP2. The amplifier includes, for example, the field effect transistor having a gate electrode, a source and a drain, and the semiconductor chip CHP2 includes a gate terminal 20 electrically connected to the gate electrode and an output terminal 30 for use in outputting an output signal generated by the amplifier. And, as shown in FIG. 2, the reading electrode 12 of the silicon drift detector 10 and the gate terminal 20 formed in the semiconductor chip CHP2 are electrically connected to each other by a wire W. Note that the semiconductor chip CHP2 also includes a DC power supply terminal, a rest pulse terminal and others.

Figure 3:
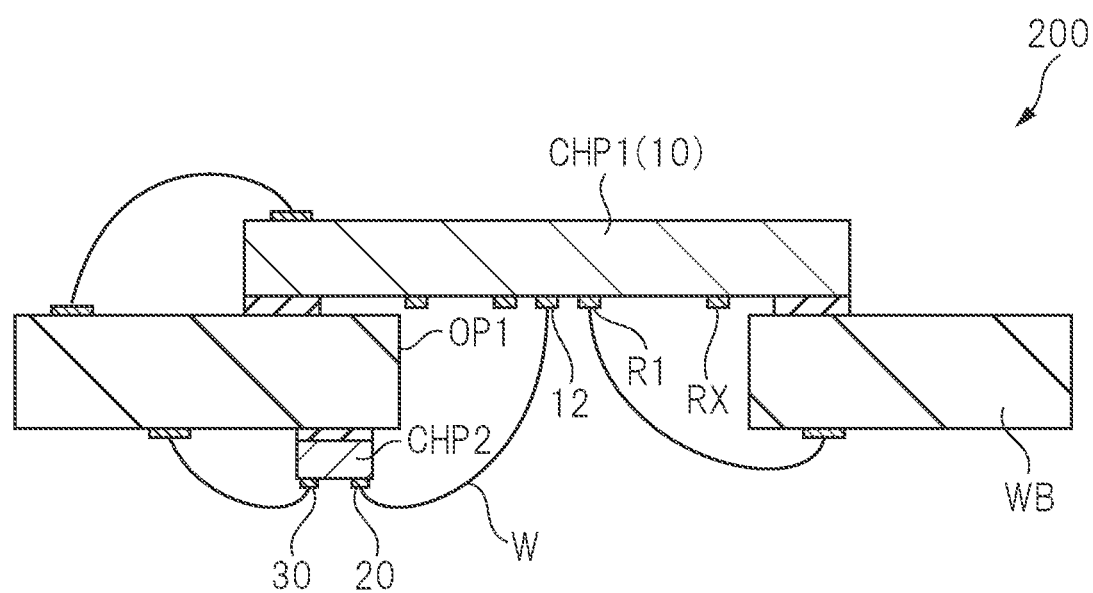
FIG. 3 is a cross-sectional view showing the mount configuration of the semiconductor detector according to the first related art.

FIG. 3 is a cross-sectional view schematically showing the mount configuration of the semiconductor detector according to the first related art.

As shown in FIG. 3, the semiconductor chip CHP1 having the silicon drift detector 10 formed therein is mounted on the upper surface of the wiring board WB. On the other hand, the semiconductor chip CHP2 having the amplifier formed therein is mounted on the lower surface of the wiring board WB. For example, in the first related art, the reading electrode 12 formed in the semiconductor chip CHP1 and the gate terminal 20 formed in the semiconductor chip CHP2 are electrically connected to each other by the wire W.

<Margin for Improvement of First Related Art>

However, when the reading electrode 12 and the gate terminal 20 are electrically connected to each other by the wire W, the wire W necessarily contains a parasitic capacitance and a parasitic inductance. Because of this, noises due to the parasitic capacitance and the parasitic inductance are superimposed on the signal output from the reading electrode 12. Particularly, since the signal based on the electric charge amount collected to the reading electrode is weak, even extremely small noises cause large adverse influence. Therefore, in order to improve the sensitivity of the semiconductor detector 200 including the silicon drift detector 10 and the amplifier to the measurement of the X-ray energy, an electric connection structure connecting the gate terminal 20 and the reading electrode 12 for achieving suppression of the parasitic capacitance and the parasitic inductance is desirable.

<Explanation for Second Related Art>

Regarding this point, the following second related art is exemplified.

Figure 4:
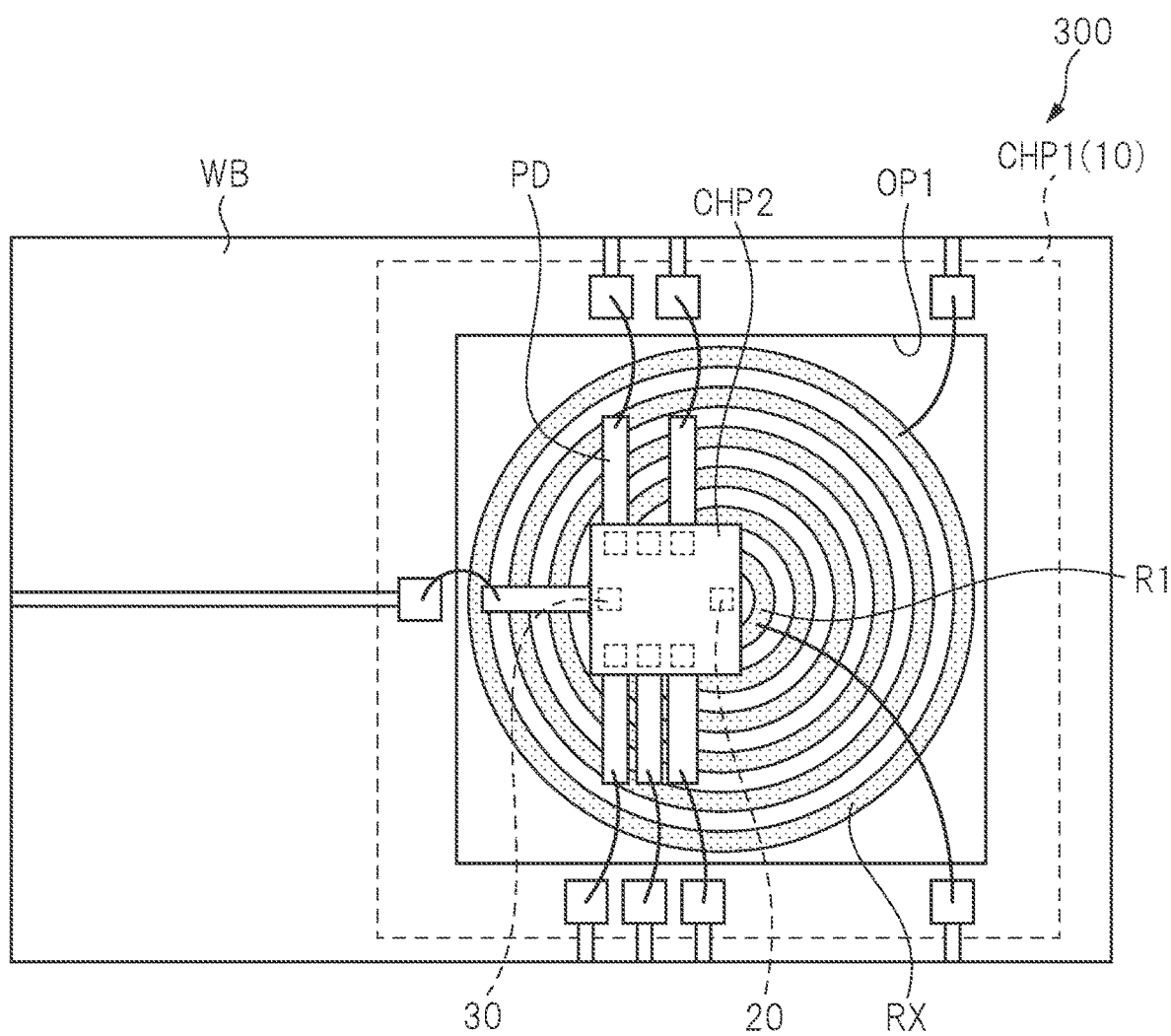
FIG. 4 is a planar view showing a mount configuration of a semiconductor detector according to a second related art.

FIG. 4 is a planar view schematically showing a mount configuration of a semiconductor detector according to the second related art.

In FIG. 4, a semiconductor detector 300 includes a wiring board WB on which a plurality of wirings are formed. FIG. 4 is a planar view in view from a lower surface of the wiring board WB. A semiconductor chip CHP1 having a silicon drift detector 10 formed therein is mounted on an upper surface of the wiring board WB. In FIG. 4, a back surface ("ring surface") of the semiconductor chip CHP1 mounted on the upper surface of the wiring board WB is visible through an opening OP1 formed in the wiring board WB.

In FIG. 4, a semiconductor chip CHP2 is arranged so as to overlap the semiconductor chip CHP1 in a planar view. More specifically, an interlayer insulating film (not illustrated) is formed so as to cover the "ring surface" of the semiconductor chip CHP1, and a plurality of pads PD are formed on this interlayer insulating film. In a planar view, the semiconductor chip CHP2 is arranged so as to overlap a pad layer having the plurality of pads PD formed therein. In this manner, in the semiconductor detector 300 according to the second related art, the semiconductor chip CHP1 and the semiconductor chip CHP2 are arranged to be layered so as to overlap each other in a planar view.

Figure 5:
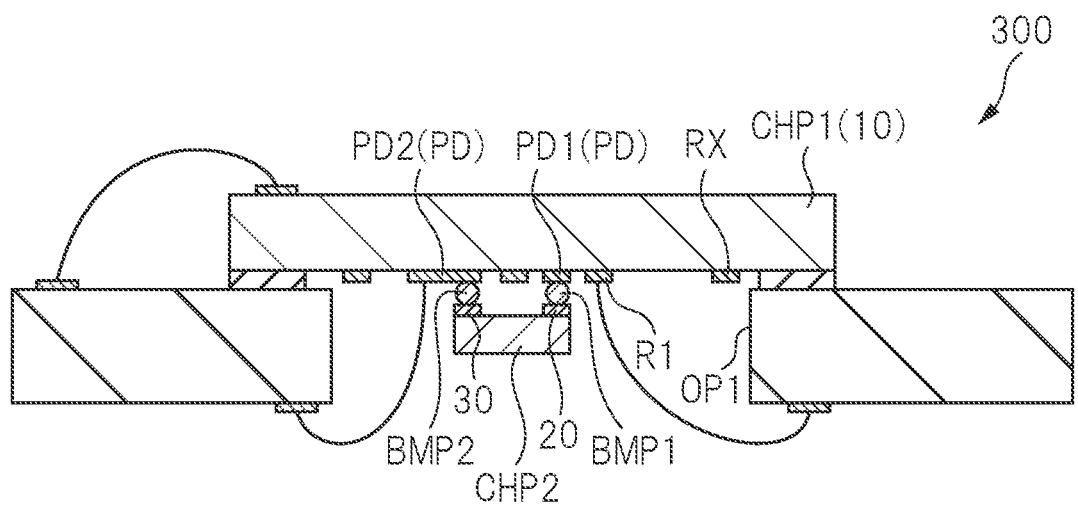
FIG. 5 is a cross-sectional view showing the mount configuration of the semiconductor detector according to the second related art.

FIG. 5 is a cross-sectional view schematically showing the mount configuration of the semiconductor detector according to the second related art.

As shown in FIG. 5, the semiconductor chip CHP1 having the silicon drift detector 10 formed therein is mounted on the upper surface of the wiring board WB. And, the semiconductor chip CHP2 having the amplifier formed therein is arranged in the lower surface of the semiconductor chip CHP1 so as to overlap the semiconductor chip CHP1 in a planar view. That is, in the second related art, the semiconductor chip CHP1 and the semiconductor chip CHP2 are connected to each other in a flip-chip connection state. More specifically, as shown in FIG. 5, a reading electrode pad PD1 formed in the semiconductor chip CHP1 and a gate terminal 20 formed in the semiconductor chip CHP2 are electrically connected to each other through a bump electrode (protruding electrode) BMP1. Similarly, an output electrode pad PD2 formed in the semiconductor chip CHP1 and an output terminal 30 formed in the semiconductor chip CHP2 are electrically connected to each other through a bump electrode BMP2.

In the semiconductor detector 300 according to the second related art configured as described above, the reading electrode pad PD1 formed in the semiconductor chip CHP1 and the gate terminal 20 formed in the semiconductor chip CHP2 are electrically connected to each other through not the wire W but the bump electrode BMP1. Therefore, increase of the noises caused by the parasitic capacitance and the parasitic inductance due to the wire W can be suppressed. That is, according to the second related art, not the wire connection structure but the flip-chip connection structure is adopted for the electric connection structure connecting the semiconductor chip CHP1 and the semiconductor chip CHP2, so that the parasitic capacitance and the parasitic inductance can be reduced.

<Margin for Improvement Existing in Second Related Art>

As described above, in the second related art, the wire W is not used for the connection between the reading electrode 12 and the gate terminal 20, and therefore, it is conceivable that the parasitic capacitance and the parasitic inductance due to the wire W can be suppressed. However, according to the studies of the present inventors, it has been newly found that it is necessary to study the improvement since even the flip-chip connection structure is not sufficient in a point of view of the suppression of the occurrence of the noises due to the connection structure connecting the reading electrode pad PD1 and the gate terminal 20. Thus, the margin for the improvement existing in the second related art will be explained below.

Figure 6:
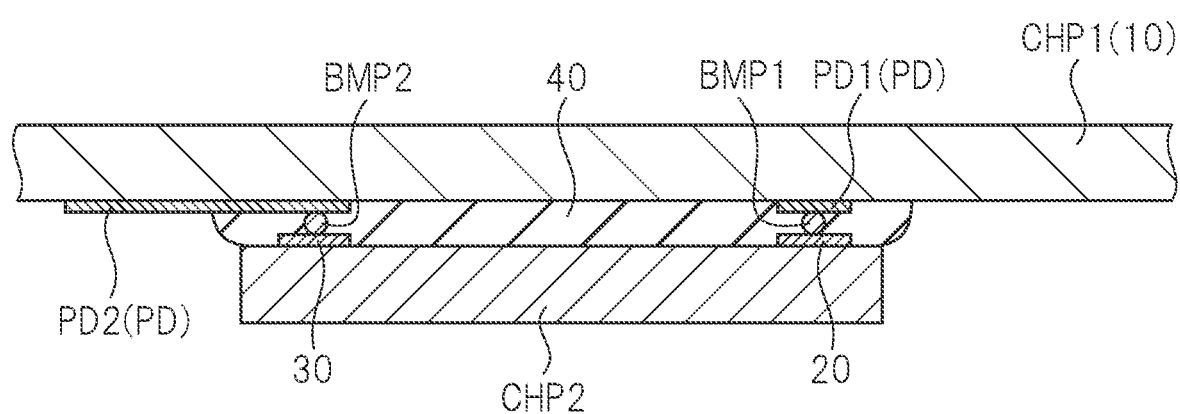
FIG. 6 is an enlarged view showing a connection structure connecting a first semiconductor chip and a second semiconductor chip.

FIG. 6 is an enlarged view schematically showing the connection structure connecting the semiconductor chip CHP1 and the semiconductor chip CHP2. In FIG. 6, the reading electrode pad PD1 and the gate terminal 20 are electrically connected to each other by the bump electrode BMP1, and the output electrode pad PD2 and the output terminal 30 are electrically connected to each other by the bump electrode BMP2. In this manner, the semiconductor chip CHP1 and the semiconductor chip CHP2 are connected to each other in the flip-chip connection state. As shown in FIG. 6, an underfill 40 made of, for example, an insulating resin is injected into a gap between the semiconductor chip CHP1 and the semiconductor chip CHP2 that are connected in the flip-chip connection state. This is for improving a connection strength between the semiconductor chip CHP1 and the semiconductor chip CHP2.

However, the underfill 40 is made of the insulating resin, and has a high permittivity. Therefore, the present inventors have newly found that the injection of the underfill 40 as covering the periphery of the connection structure connecting the reading electrode pad PD1 and the gate terminal 20 through the bump electrode BMP1 causes an unignorable parasitic capacitance due to the underfill 40, which results in the increase of the noises. In other words, while the flip-chip connection structure can reduce the parasitic capacitance and the parasitic inductance due to the wire W, it is difficult to suppress the noises because of the parasitic capacitance due to the underfill 40 that is essential for the flip-chip connection structure. This issue is the margin for the improvement of the second related art.

Accordingly, in the present first embodiment, a devisal has been applied to the margin for the improvement existing in the second related art. Hereinafter, a technical concept of the present first embodiment applied with this devisal will be explained.

<Basic Concept of First Embodiment>

Figure 7:
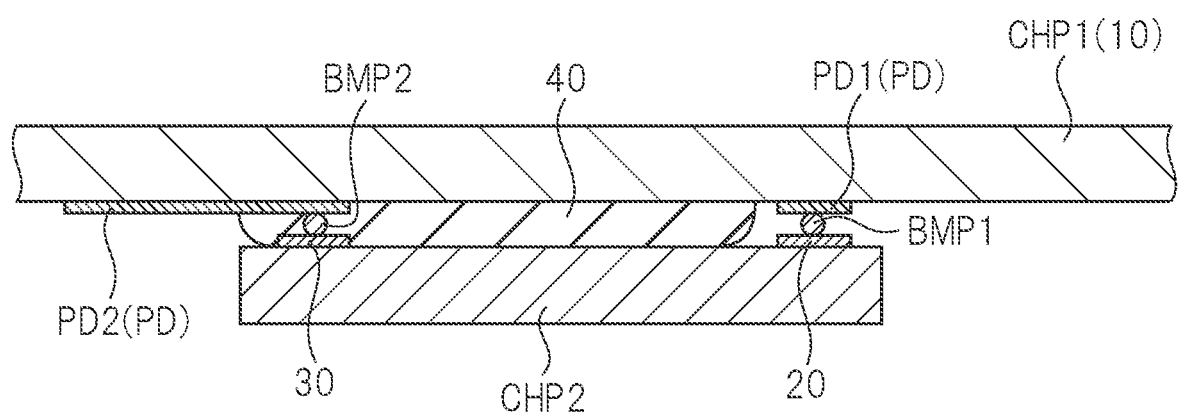
FIG. 7 is a diagram for explaining a basic concept of a first embodiment.

FIG. 7 is a diagram for explaining a basic concept of the present first embodiment.

In FIG. 7, the basic concept of the present first embodiment is a concept based on the injection of the underfill 40 into the gap between the semiconductor chip CHP1 and the semiconductor chip CHP2 in the flip-chip connection state, and the concept is no formation of the underfill 40 in the periphery of the connection structure connecting the reading electrode pad PD1 and the gate terminal 20 through the bump electrode BMP1. In other words, the basic concept of the present first embodiment is the injection of the underfill 40 into the gap between the semiconductor chip CHP1 and the semiconductor chip CHP2 in the flip-chip connection state except for the periphery of the connection structure connecting the reading electrode pad PD1 and the gate terminal 20 through the bump electrode BMP1. According to the basic concept of the present first embodiment, while the connection strength between the semiconductor chip CHP1 and the semiconductor chip CHP2 in the flip-chip connection state can be secured by the underfill 40, the increase of the parasitic capacitance due to the underfill 40 can be suppressed because of no intervention of the underfill 40 in the periphery of the connection structure connecting the reading electrode pad PD1 and the gate terminal 20 through the bump electrode BMP1.

That is, according to the present first embodiment, when the periphery of the connection structure connecting the reading electrode pad PD1 and the gate terminal 20 through the bump electrode BMP1 is vacuumed so as to have a low permittivity, the increase of the parasitic capacitance due to the underfill 40 having the high permittivity can be suppressed. As a result, according to the present first embodiment, the increase of the noises due to the parasitic capacitance can be suppressed, and therefore, the sensitivity of the semiconductor detector to the measurement of the X-ray energy can be improved.

Figure 8:
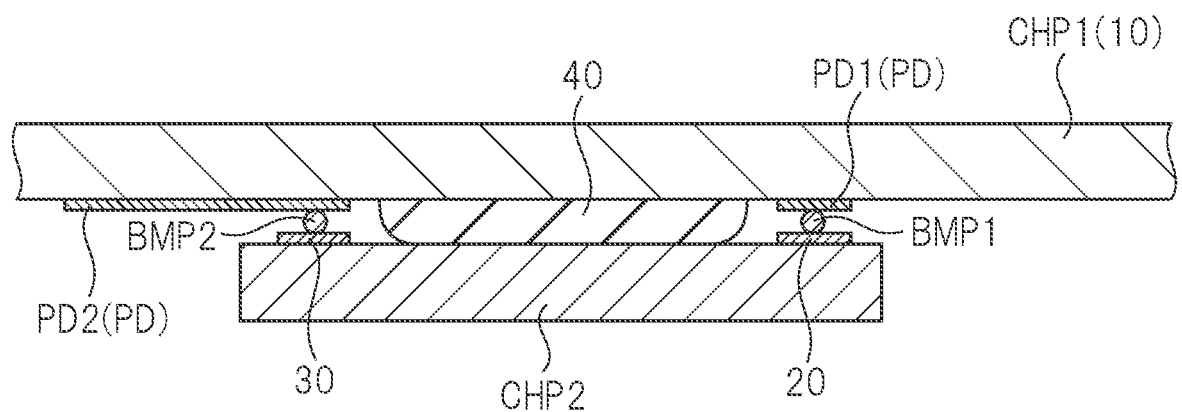
FIG. 8 is a diagram for explaining a concept derived from the basic concept.

Further, FIG. 8 is a diagram for explaining a concept derived from the basic concept.

As shown in FIG. 8, the concept derived from the basic concept is a concept without not only the intervention of the underfill 40 in the periphery of the connection structure connecting the reading electrode pad PD1 and the gate terminal 20 through the bump electrode BMP1 but also intervention of the underfill 40 in periphery of the connection structure connecting the output electrode pad PD2 and the output terminal 30 through the bump electrode BMP2.

According to this concept, the noises due to the parasitic capacitance can be suppressed from being superimposed on the weak signal output from the reading electrode pad PD1, and besides, the noises due to the parasitic capacitance can be also suppressed from being superimposed on the amplified signal that is amplified by the amplifier formed in the semiconductor chip CHP2 and output from the output terminal 30. In this manner, according to the concept derived from the basic concept, the sensitivity to the measurement of the X-ray energy can be further improved.

For example, the basic concept of the present first embodiment is achieved as follows.

First, the semiconductor chip CHP1 having the reading electrode 12 and the reading electrode pad PD1 electrically connected to the reading electrode 12 formed therein is prepared, and the semiconductor chip CHP2 having the amplifier is prepared. Next, the semiconductor chip CHP1 and the semiconductor chip CHP2 are connected to each other in the flip-chip connection state so that the reading electrode pad PD1 and the amplifier are electrically connected to each other. Then, the underfill 40 is injected into the gap between the semiconductor chip CHP1 and the semiconductor chip CHP2 except for the first connection portion connecting the reading electrode pad PD1 and the amplifier. This manner achieves the basic concept of no formation of the underfill 40 in the periphery of the first connection portion connecting the reading electrode pad PD1 and the amplifier.

Hereinafter, a specific devisal for the injection of the underfill 40 into the gap between the semiconductor chip CHP1 and the semiconductor chip CHP2 except for the first connection portion connecting the reading electrode pad PD1 and the amplifier will be explained on the basis of a plurality of specific aspects.

<First Specific Aspect>

Subsequently, a specific aspect of an embodied basic concept of the present first embodiment will be explained.

Figure 9:
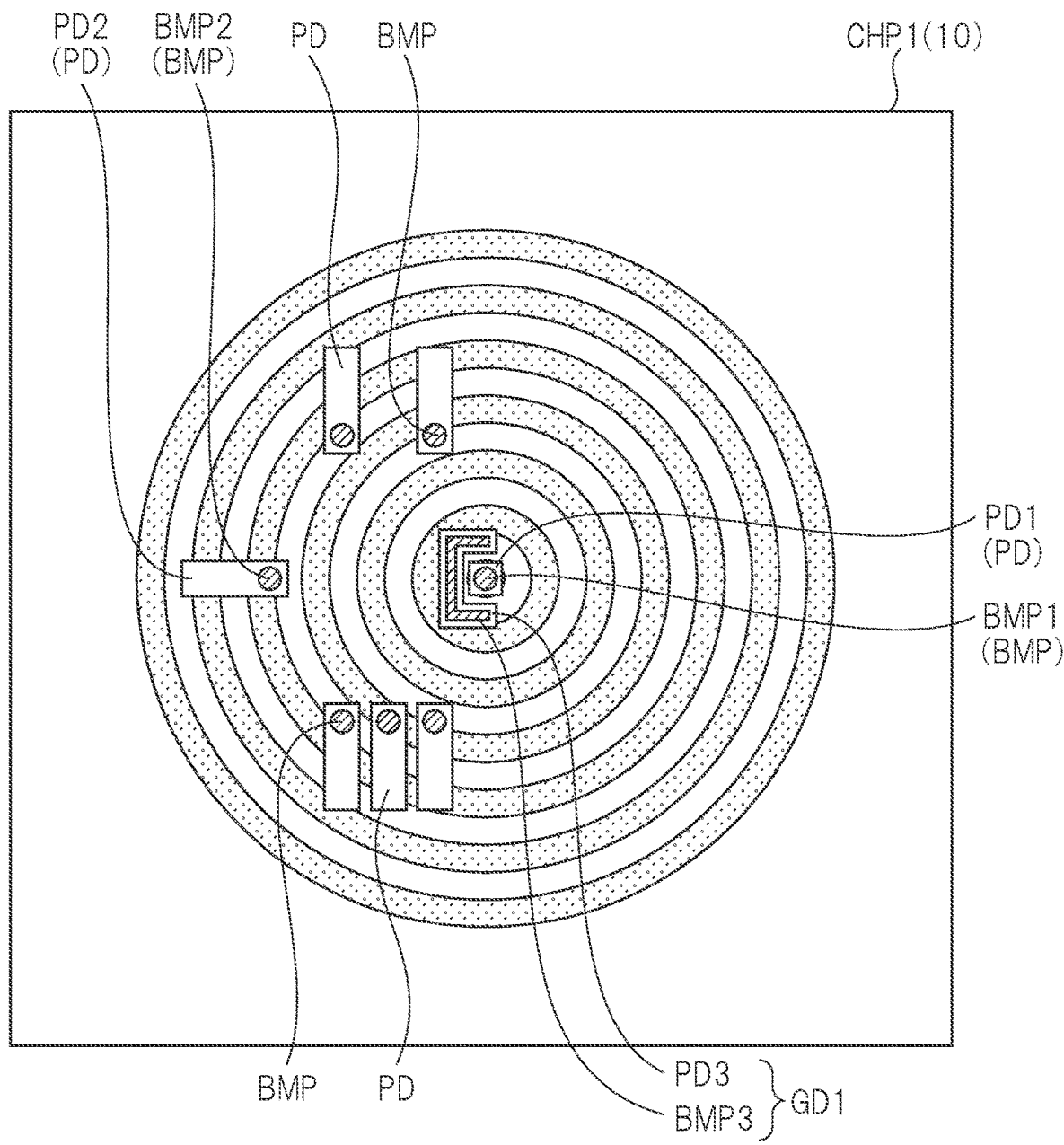
FIG. 9 is a planar view showing a configuration of the first semiconductor chip.

FIG. 9 is a planar view showing a schematic configuration of the semiconductor chip CHP1.

In FIG. 9, a plurality of concentrically-arranged ring electrodes are formed in the "ring surface" of the semiconductor chip CHP1 having the silicon drift detector 10 formed therein, and a plurality of pad electrodes PD are arranged in an upper layer of the layer where the plurality of ring electrodes are formed. On each of the plurality of pad electrodes PD, the bump electrode BMP is formed. More specifically, one of the plurality of pad electrodes PD is the reading electrode pad PD1 electrically connected to the reading electrode, and a bump electrode BMP1 is mounted on this reading electrode pad PD1. Another one of the plurality of pad electrodes PD is the output electrode pad PD2, and the bump electrode BMP2 is mounted on this output electrode pad PD2.

Further, as shown in FIG. 9, a guide portion GD1 is formed in the semiconductor chip CHP1. This guide portion GD1 is made of a pad portion PD3 and a protruding portion BMP3 formed on the pad portion PD3. In this case, the pad portion PD3 is formed in a pad layer where the plurality of pad electrodes PD are formed. The protruding portion BMP3 is made of the same material as that of the bump electrode BMP.

Figure 10:
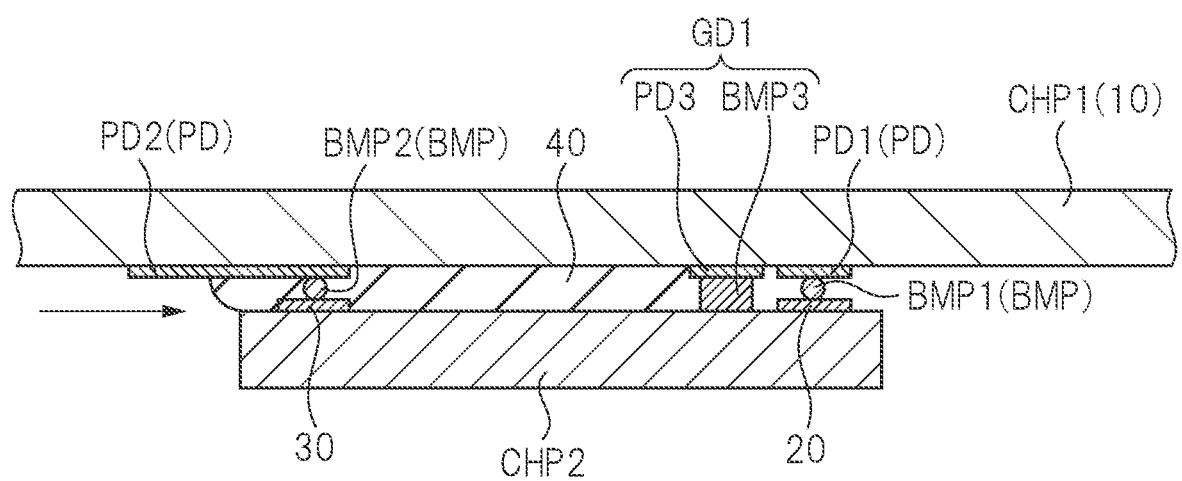
FIG. 10 is a cross-sectional view showing a flip-chip structure connecting the first semiconductor chip and the second semiconductor chip.

Next, FIG. 10 is a cross-sectional view schematically showing the flip-chip connection structure connecting the semiconductor chip CHP1 and the semiconductor chip CHP2.

In FIG. 10, the reading electrode pad PD1 formed in the semiconductor chip CHP1 and the gate terminal 20 formed in semiconductor chip CHP2 are connected to each other by the bump electrode BMP1. In this case, the connection structure connecting the reading electrode pad PD1 and the gate terminal 20 through the bump electrode BMP1 is referred to as "first connection structure".

In FIG. 10, the output electrode pad PD2 formed in the semiconductor chip CHP1 and the output terminal 30 formed in semiconductor chip CHP2 are connected to each other by the bump electrode BMP2. In this case, the connection structure connecting the output electrode pad PD2 and the output terminal 30 through the bump electrode BMP2 is referred to as "second connection structure".

In this manner, the flip-chip connection between the semiconductor chip CHP1 and the semiconductor chip CHP2 is achieved by the "first connection structure" and the "second connection structure". In the first specific aspect, as shown in FIG. 10, the guide portion GD1 is formed between the "first connection structure" and the "second connection structure". This guide portion GD1 is made of the pad portion PD3 and the protruding portion BMP3. When the guide portion GD1 is formed between the semiconductor chip CHP1 and semiconductor chip CHP2, the "first connection structure" can be suppressed from being surrounded by the underfill 40. That is, the guide portion GD1 is formed in order to suppress the surrounding of the "first connection structure" by the underfill 40. As a result, the "first connection structure" is surrounded by a space having a lower permittivity than that of the underfill 40.

As the first specific aspect, when the guide portion GD1 made of the pad portion PD3 and the protruding portion BMP3 is formed between the "first connection structure" and the "second connection structure", the basic concept of no formation of the underfill 40 in the periphery of the "first connection structure" is embodied.

For example, the configuration of the first specific aspect is achieved as follows.

First, the semiconductor chip CHP1 having the reading electrode, the reading electrode pad PD1 electrically connected to the reading electrode, the output electrode pad PD2 and the pad portion PD3 formed therein are prepared. Next, the semiconductor chip CHP2 having the amplifier made of, for example, the field effect transistor having the gate electrode, the source and the drain is prepared. In this process, the semiconductor chip CHP2 has the gate terminal 20 electrically connected to the gate electrode.

Subsequently, the bump electrode BMP1 is arranged on the reading electrode pad PD1, the bump electrode BMP2 is arranged on the output electrode pad PD2, and the protruding portion BMP3 is arranged on the pad portion PD3. Then, the semiconductor chip CHP1 and the semiconductor chip CHP2 are connected to each other in the flip-chip connection state so that the reading electrode pad PD1 and the gate terminal 20 are connected to each other through the bump electrode BMP1 and so that the output electrode pad PD2 and the output terminal 30 are connected to each other through the bump electrode BMP2. In this manner, between the semiconductor chip CHP1 and the semiconductor chip CHP2, the "first connection structure" and the "second connection structure" are formed, and the guide portion GD1 made of the pad portion PD3 and the protruding portion BMP3 is formed.

Then, the underfill 40 is injected into the gap between the semiconductor chip CHP1 and the semiconductor chip CHP2. In this process, the underfill 40 is injected in an arrow direction of FIG. 10 into the gap between the semiconductor chip CHP1 and the semiconductor chip CHP2. In this case, the underfill 40 that is injected into the gap between the semiconductor chip CHP1 and the semiconductor chip CHP2 is blocked by the guide portion GD1 and does not reach the periphery of the "first connection structure". Therefore, the configuration of the first specific aspect is achieved.

<Second Specific Aspect>

The above-described first specific aspect is the example of the guide portion GD1 including the protruding portion BMP3 made of the same conductive material as that of the bump electrode BMP. On the other hand, a second specific aspect is an example of a guide portion GD2 made of an insulating material represented by, for example, a resist material.

Figure 11:
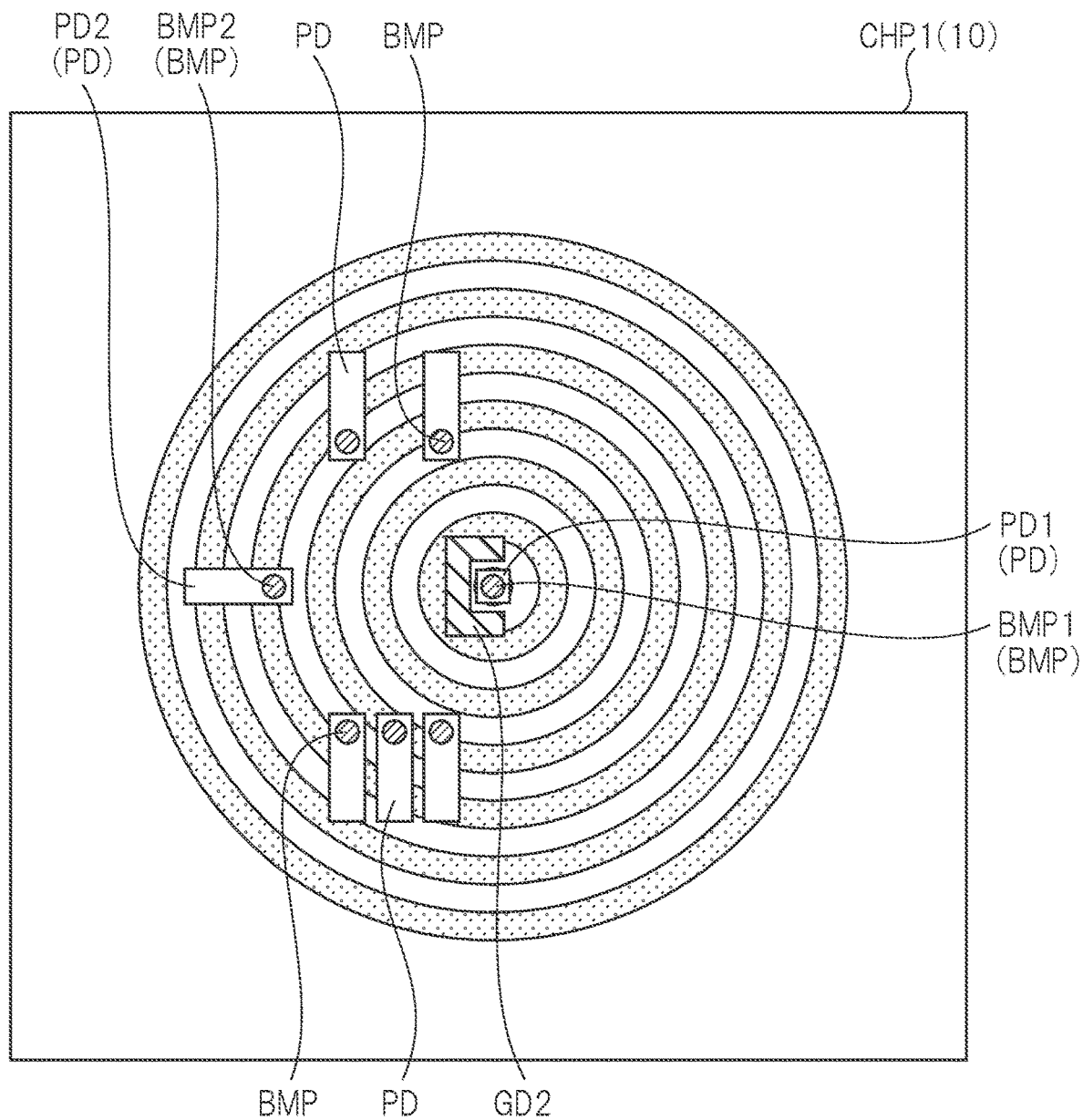
FIG. 11 is a planar view showing a configuration of the first semiconductor chip.

FIG. 11 is a planar view showing a schematic configuration of the semiconductor chip CHP1. The configuration of FIG. 11 is the same as the configuration of the first specific aspect, except for the guide portion GD2 made of the insulating material such as the resist material.

Figure 12:
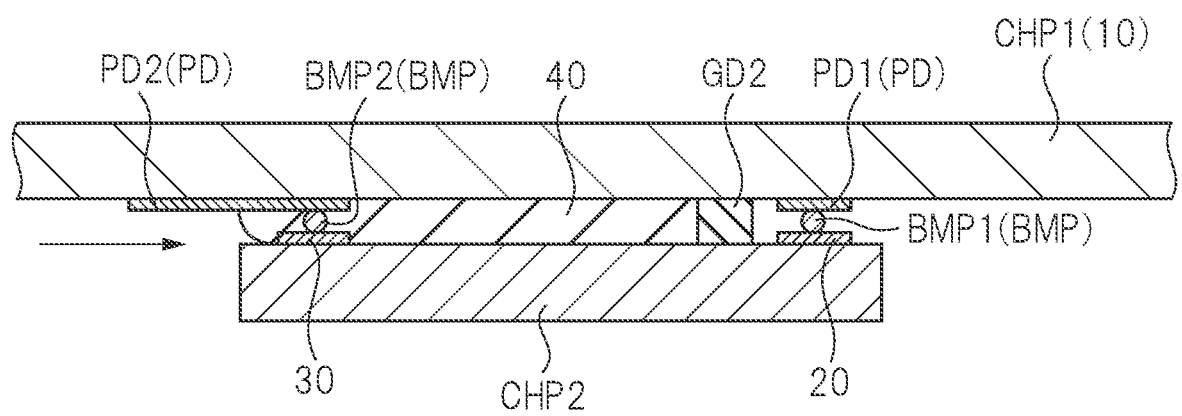
FIG. 12 is a cross-sectional view showing a flip-chip structure connecting the first semiconductor chip and the second semiconductor chip.

FIG. 12 is a cross-sectional view schematically showing the flip-chip connection structure connecting the semiconductor chip CHP1 and the semiconductor chip CHP2.

In the second specific aspect, as shown in FIG. 12, the guide portion GD2 is formed between the "first connection structure" and the "second connection structure". This guide portion GD2 is made of the insulating material such as the resist material. Even in the second specific aspect, the "first connection structure" is suppressed from being surrounded by the underfill 40 by the formation of the guide portion GD2 between the semiconductor chip CHP1 and the semiconductor chip CHP2. As a result, the "first connection structure" is surrounded by the space having the lower permittivity than that of the underfill 40.

In the manner, in the second specific aspect, since the guide portion GD2 made of the insulating material is formed between the "first connection structure" and the "second connection structure", the basic concept of no formation of the underfill 40 in the periphery of the "first connection structure" is embodied.

For example, the configuration of the second specific aspect is achieved as follows.

First, the semiconductor chip CHP1 having the reading electrode, the reading electrode pad PD1 electrically connected to the reading electrode, the output electrode pad PD2 and the guide portion GD2 made of the resist material (resist film) formed therein is prepared. In this process, the guide portion GD2 made of the resist film can be formed by, for example, applying, and then, patterning the resist material by using a photolithography technique.

Next, the semiconductor chip CHP2 having the amplifier made of, for example, the field effect transistor having the gate electrode, the source and the drain is prepared. In this process, the semiconductor chip CHP2 has the gate terminal 20 electrically connected to the gate electrode.

Subsequently, the bump electrode BMP1 is arranged on the reading electrode pad PD1, the bump electrode BMP2 is arranged on the output electrode pad PD2, and the protruding portion BMP3 is arranged on the pad portion PD3. Then, the semiconductor chip CHP1 and the semiconductor chip CHP2 are connected to each other in the flip-chip connection state so that the reading electrode pad PD1 and the gate terminal 20 are connected to each other through the bump electrode BMP1 and so that the output electrode pad PD2 and the output terminal 30 are connected to each other through the bump electrode BMP2. In this manner, between the semiconductor chip CHP1 and the semiconductor chip CHP2, the "first connection structure" and the "second connection structure" are formed, and the guide portion GD2 made of the resist material is formed.

Then, the underfill 40 is injected into the gap between the semiconductor chip CHP1 and the semiconductor chip CHP2. In this process, the underfill 40 is injected in an arrow direction of FIG. 12 into the gap between the semiconductor chip CHP1 and the semiconductor chip CHP2. In this case, the underfill 40 that is injected into the gap between the semiconductor chip CHP1 and the semiconductor chip CHP2 is blocked by the guide portion GD2 and does not reach the periphery of the "first connection structure". Therefore, the configuration of the second specific aspect is achieved.

<Third Specific Aspect>

Each of the above-described first and second specific aspects is the example of the guide portion GD1 (or the guide portion GD2) in order to avoid the formation of the underfill 40 in the periphery of the "first connection structure". On the other hand, a third specific aspect is an example of a guide portion GD3 in order to avoid the formation of the underfill 40 in the periphery of the "second connection structure" in addition to the formation of the guide portion GD1 in order to avoid the formation of the underfill 40 in the periphery of the "first connection structure".

Figure 13:
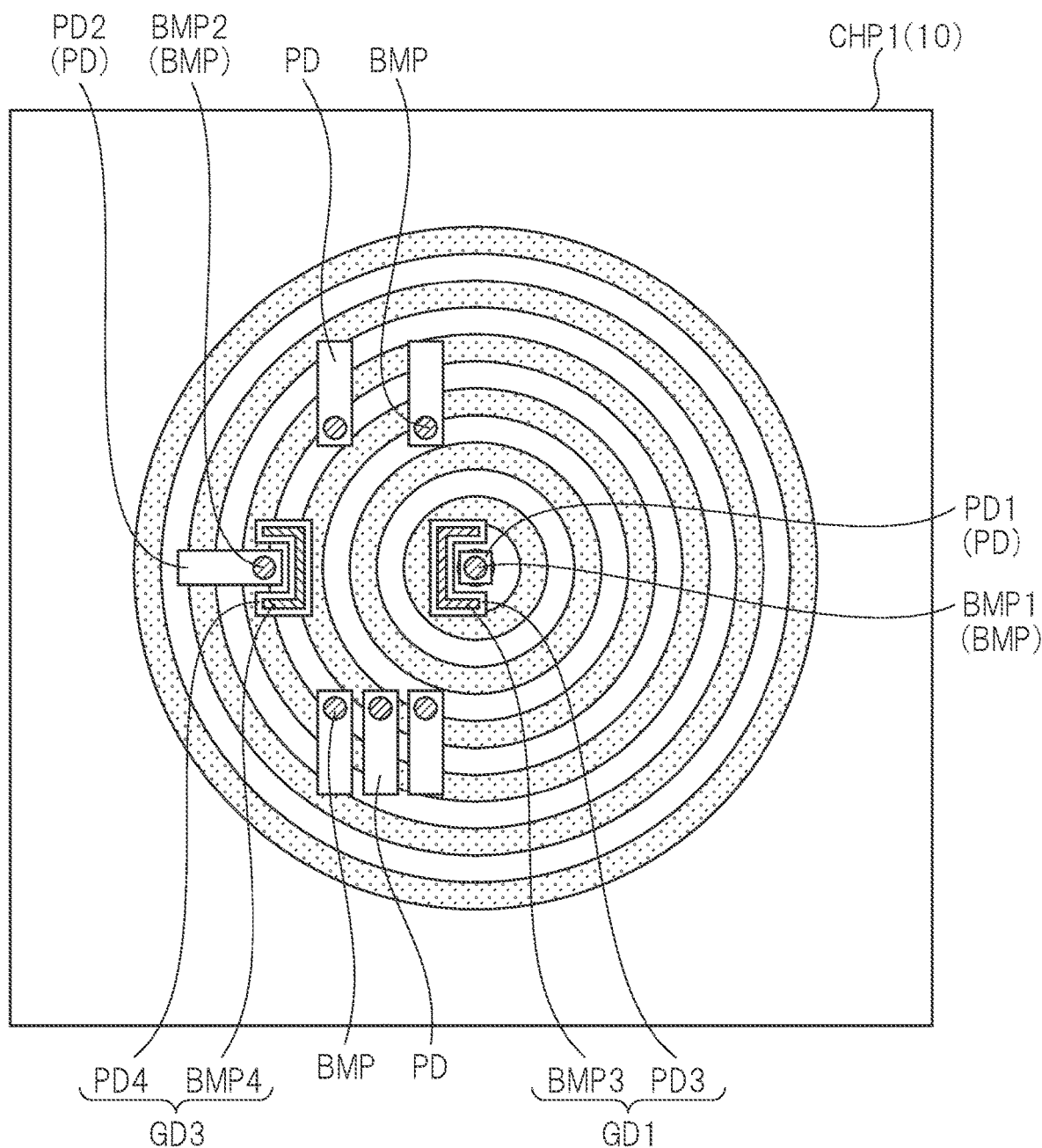
FIG. 13 is a planar view showing a configuration of the first semiconductor chip.

FIG. 13 is a planar view showing a schematic configuration of the semiconductor chip CHP1. The configuration of FIG. 13 is the same as the configuration of the first specific aspect, except for the formation of not only the guide portion GD1 but also the guide portion GD3.

Figure 14:
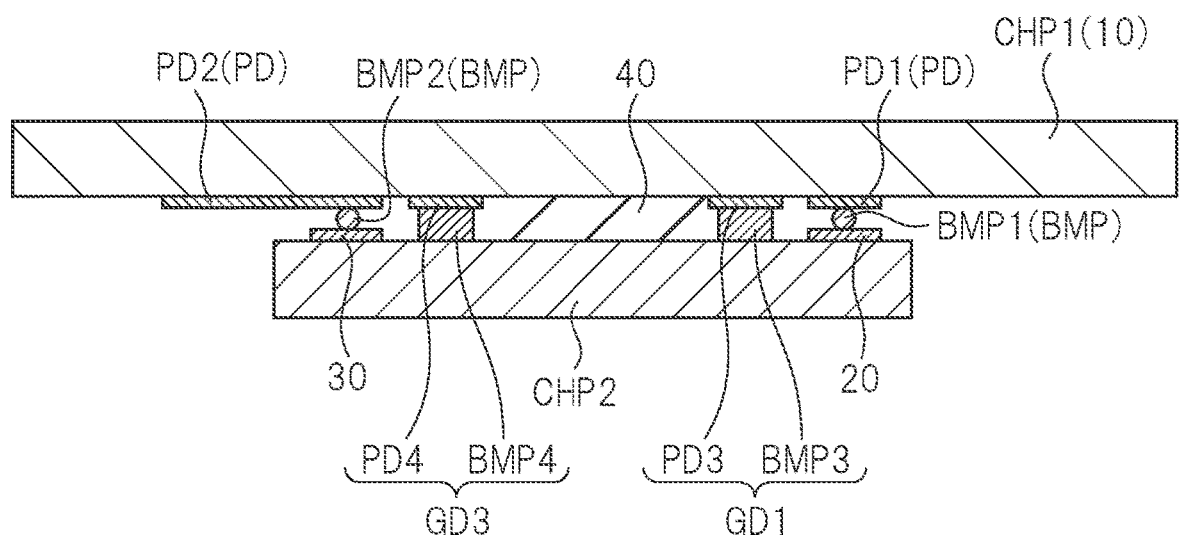
FIG. 14 is a cross-sectional view showing a flip-chip structure connecting the first semiconductor chip and the second semiconductor chip.

FIG. 14 is a cross-sectional view schematically showing the flip-chip connection structure connecting the semiconductor chip CHP1 and the semiconductor chip CHP2.

In the third specific aspect, as shown in FIG. 14, not only the guide portion GD1 but also the guide portion GD3 are formed between the "first connection structure" and the "second connection structure". This guide portion GD3 is made of a pad portion PD4 and a protruding portion BMP4. In the third specific aspect, by the formations of the guide portion GD1 and the guide portion GD3 between the semiconductor chip CHP1 and the semiconductor chip CHP2, both the "first connection structure" and the "second connection structure" are suppressed from being surrounded by the underfill 40. As a result, each of the "first connection structure" and the "second connection structure" is surrounded by the space having the lower permittivity than that of the underfill 40.

In the manner, in the third specific aspect, since the guide portion GD1 and the guide portion GD3 are formed between the "first connection structure" and the "second connection structure", the basic concept of no formation of the underfill 40 in the periphery of the "first connection structure" is embodied, and besides, the configuration of no formation of the underfill 40 in the periphery of the "second connection structure" is also achieved.

For example, the configuration of the third specific aspect is achieved as follows.

First, the semiconductor chip CHP1 having the reading electrode, the reading electrode pad PD1 electrically connected to the reading electrode, the output electrode pad PD2 and the pad portions PD3 and PD4 formed therein is prepared.

Next, the semiconductor chip CHP2 having the amplifier made of, for example, the field effect transistor having the gate electrode, the source and the drain is prepared. In this process, the semiconductor chip CHP2 has the gate terminal 20 electrically connected to the gate electrode and the output terminal 30 for use in outputting the amplified signal.

Subsequently, the bump electrode BMP1 is arranged on the reading electrode pad PD1, the bump electrode BMP2 is arranged on the output electrode pad PD2, the protruding portion BMP3 is arranged on the pad portion PD3, and the protruding portion BMP4 is arranged on the pad portion PD4.

Then, the semiconductor chip CHP1 and the semiconductor chip CHP2 are connected to each other in the flip-chip connection state so that the reading electrode pad PD1 and the gate terminal 20 are connected to each other through the bump electrode BMP1 and so that the output electrode pad PD2 and the output terminal 30 are connected to each other through the bump electrode BMP2. In this manner, between the semiconductor chip CHP1 and the semiconductor chip CHP2, the "first connection structure" and the "second connection structure" are formed. And, the guide portion GD1 made of the pad portion PD3 and the protruding portion BMP3 and the guide portion GD3 made of the pad portion PD4 and the protruding portion BMP4 are formed between the semiconductor chip CHP1 and the semiconductor chip CHP2.

Then, the underfill 40 is injected into the gap between the semiconductor chip CHP1 and the semiconductor chip CHP2. In this process, the underfill 40 that is injected into the gap between the semiconductor chip CHP1 and the semiconductor chip CHP2 is blocked by the guide portion GD1 and does not reach the periphery of the "first connection structure", and besides, is blocked by the guide portion GD3 and does not reach the periphery of the "second connection structure". Therefore, the configuration of the third specific aspect is achieved.

<Feature of First Embodiment>

Next, a feature point of the present first embodiment will be explained.

The feature point of the present first embodiment is that the guide portion GD1 is formed between the "first connection structure" and the "second connection structure" in order to suppress the covering of the "first connection structure" with the underfill 40 to embody the above-described basic concept. In this manner, the underfill 40 that is injected into the gap between the semiconductor chip CHP1 and the semiconductor chip CHP2 is blocked by the guide portion GD1 before reaching the "first connection structure". As a result, the "first connection structure" is not covered with the underfill 40 but surrounded by the space having the lower permittivity than that of the underfill 40. In this manner, according to the present first embodiment, the increase of the parasitic capacitance due to the underfill 40 can be suppressed. That is, according to the present first embodiment, since the periphery of the "first connection structure" between the reading electrode pad PD1 and the gate terminal 20 through the bump electrode BMP1 is the space having the lower permittivity, the increase of the parasitic capacitance due to the underfill 40 having the higher permittivity can be suppressed. Therefore, according to the present first embodiment, the increase of the noises due to the parasitic capacitance can be suppressed, and thus, the sensitivity of the semiconductor detector 100 to the measurement of the X-ray energy can be improved.

Particularly, a large technical significance of the feature point of the present first embodiment is to form the space in the periphery of the "first connection structure". This is because the semiconductor detector 100 including the silicon drift detector 10 is used in a vacuum state. That is, in the semiconductor detector 100, this is because it can be said that the formation of the space in the periphery of the "first connection structure" means that the periphery of the "first connection structure" is vacuumed, and is desirable in order to effectively reduce the parasitic capacitance because a permittivity of the vacuum state is the lowest.

Note that a reason why the semiconductor detector 100 is used in the vacuum state is as follows. In the semiconductor detector 100, it is necessary to reduce a dark current to be a cause of the noises, and, the higher a temperature is, the larger the dark current is. Therefore, in the semiconductor detector 100, a Peltier element is used for cooling to reduce the dark current to be the cause of the noises. In this process, when the semiconductor detector 100 is used in air, there is a concern of corrosion of the semiconductor detector 100 due to condensation of water moisture in the air or increase of the dark current because of the cooled semiconductor detector 100. Because of such a reason, the semiconductor detector 100 including the silicon drift detector 10 is used in the vacuum state.

The feature point of the present first embodiment is achieved by, for example, the above-described first, second and third specific aspects. For example, since the protruding portion BMP3 of the guide portion GD1 is made of the same conductive material as that of the bump electrode BMP, an advantage of the first specific aspect is exemplified to be easiness of the height adjustment and easiness of insertion of the step of forming the guide portion GD1 into the step of forming the "first connection structure".

And, since the guide portion GD2 is made of the insulating material represented by the resist material, an advantage of the second specific aspect is exemplified to be no concern of adverse electric influence on the closely-arranged "first connection structure". And, in utilization of characteristics of the resist capable of simultaneously forming a plurality of micro patterns, this is exemplified to be, for example, no concern of adverse electric influence on other terminals (the output terminal, the DC power supply terminal, the rest pulse terminal and others) other than the "first connection structure" and others.

Further, an advantage of the third specific aspect is exemplified to be capable of forming the space having the low permittivity in in the periphery of the "first connection structure" because of the guide portion GD1, and besides, to be capable of forming the space having the low permittivity in the periphery of the "second connection structure" because of the guide portion GD3. According to such a third specific aspect, the noises superimposed on the weak output signal from the reading electrode pad PD1 can be reduced, and besides, the superimposed noises in the output of the amplified signal of the weak signal from the output terminal can be also reduced. Therefore, the sensitivity of the semiconductor detector 100 to the measurement of the X-ray energy can be further improved.

Further, as an applied example of the third specific aspect, a guide portion can be also formed in the peripheries of the DC power supply terminal, the reset pulse terminal and others other than the gate terminal 20 and the output terminal 30 of the amplifier 15 so as not to intervene the underfill. This configuration is effective for further reduction of the noises superimposed on the weak signal.

Second Embodiment

<Basic Concept of Second Embodiment>

The basic concept of the first embodiment is based on the injection of the underfill 40 into the gap between the semiconductor chip CHP1 and the semiconductor chip CHP2 in the flip-chip connection state, and the concept is no formation of the underfill 40 in the periphery of the "first connection structure" between the reading electrode pad PD1 and the gate terminal 20 through the bump electrode BMP1.

On the other hand, a basic concept of the present second embodiment is no injection of the underfill 40 into the gap between the semiconductor chip CHP1 and the semiconductor chip CHP2 in the flip-chip connection state. According to this basic concept, since the underfill 40 having a high permittivity does not intervene in the periphery of the "first connection structure", the increase of the parasitic capacitance due to the underfill 40 can be suppressed. As a result, according to the present second embodiment, the noises superimposed on the weak signal that passes the "first connection structure" can be reduced, and therefore, the sensitivity of the semiconductor detector 100 to the measurement of the X-ray energy can be improved.

However, when the underfill 40 is not injected into the gap between the semiconductor chip CHP1 and the semiconductor chip CHP2 in the flip-chip connection state, the issue of the reduction of the connection strength between the semiconductor chip CHP1 and the semiconductor chip CHP2 arises. That is, in order to achieve the basic concept of the present second embodiment, a devisal for suppressing the reduction of the connection strength between the semiconductor chip CHP1 and the semiconductor chip CHP2 is necessary.

Accordingly, the present second embodiment is based on the application of the basic concept of no injection of the underfill 40 into the gap between the semiconductor chip CHP1 and the semiconductor chip CHP2 in the flip-chip connection state in order to suppress the increase of the parasitic capacitance due to the underfill 40, and is applied with the devisal for suppressing the reduction of the connection strength between the semiconductor chip CHP1 and the semiconductor chip CHP2 due to the application of this basic concept. A technical concept of the present second embodiment applied with this devisal will be explained below.

<Specific Aspect of Second Embodiment>

Figure 15:
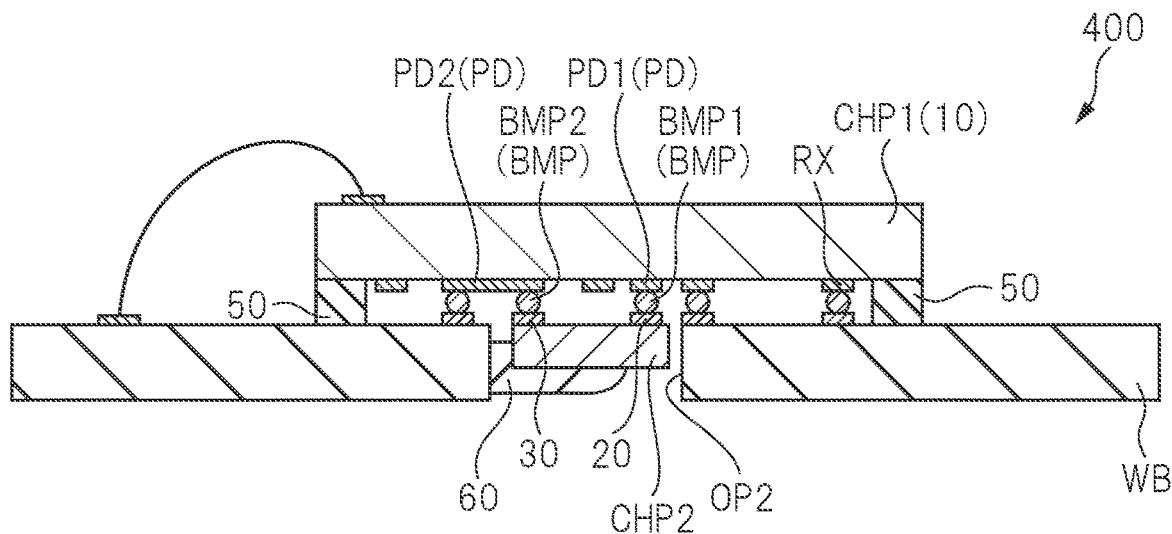
FIG. 15 is a cross-sectional view showing a configuration of a semiconductor detector according to a second embodiment.

FIG. 15 is a cross-sectional view showing a schematic configuration of a semiconductor detector according to the present second embodiment.

In FIG. 15, a semiconductor detector 400 includes a semiconductor chip CHP1 having a silicon drift detector 10 formed therein. In this semiconductor chip CHP1, a reading electrode pad PD1 and an output electrode pad PD2 are formed. The semiconductor detector 400 includes a wiring board WB that is connected to the semiconductor chip CHP1 in a flip-chip connection state and that has an opening OP2.

The wiring board WB and the semiconductor chip CHP1 are connected to each other by, for example, an adhesive 50. The semiconductor detector 400 further includes an amplifier electrically connected to the reading electrode pad PD1 formed in the semiconductor chip CHP1, and includes a semiconductor chip CHP2 that is arranged inside the opening OP2 and that is connected to the semiconductor chip CHP1 in a flip-chip connection state. In this semiconductor chip CHP2, the amplifier made of a field effect transistor having a gate electrode, a source and a drain is formed. In this case, the semiconductor chip CHP2 has a gate terminal 20 electrically connected to the gate electrode and an output terminal 30 that outputs an amplified signal that is amplified by the amplifier.

As shown in FIG. 15, the reading electrode pad PD1 formed in the semiconductor chip CHP1 and the gate terminal 20 formed in the semiconductor chip CHP2 are connected to each other by the bump electrode BMP1 ("first connection structure"). On the other hand, as shown in FIG. 15, the output electrode pad PD2 formed in the semiconductor chip CHP1 and the output terminal 30 formed in the semiconductor chip CHP2 are connected to each other by the bump electrode BMP2 ("second connection structure").

In this manner, the flip-chip connection between the semiconductor chip CHP1 and the semiconductor chip CHP2 is achieved by the "first connection structure" and the "second connection structure". In this manner, in the semiconductor detector 400 according to the present second embodiment, the wiring board WB and the semiconductor chip CHP1 are connected to each other in the flip-chip connection state, and the semiconductor chip CHP1 and the semiconductor chip CHP2 are also connected to each other in the flip-chip connection state. However, in the present second embodiment, the underfill does not intervene between the semiconductor chip CHP1 and the semiconductor chip CHP2 including the "first connection structure" between the reading electrode pad PD1 and the gate terminal 20 through the bump electrode BMP1 and the "second connection structure" between the output electrode pad PD2 and the output terminal 30 through the bump electrode BMP2. In this manner, according to the present second embodiment, since the underfill having the high permittivity does not intervene in the periphery of the "first connection structure", the increase of the parasitic capacitance due to the underfill can be suppressed. As a result, according to the present second embodiment, the noises superimposed on the weak signal that passes through the "first connection structure" can be reduced, and therefore, the sensitivity of the semiconductor detector 400 to the measurement of the X-ray energy can be improved.

However, when the underfill is not injected into the gap between the semiconductor chip CHP1 and the semiconductor chip CHP2 as shown in FIG. 15, there is a concern of the reduction of the connection strength between the semiconductor chip CHP1 and the semiconductor chip CHP2.

Regarding this point, the following devisal has been made to the semiconductor detector 400 according to the present second embodiment in order to suppress the reduction of the connection strength between the semiconductor chip CHP1 and the semiconductor chip CHP2. That is, as shown in FIG. 15, the semiconductor chip CHP2 is fixed at inside of the opening OP2 formed in the wiring board WB by an adhesive 60. In this manner, according to the present second embodiment, even without the usage of the underfill, the reliability of the connection between the semiconductor chip CHP1 and the semiconductor chip CHP2 can be improved by the firm fixation of the semiconductor chip CHP2 to the wiring board WB by the adhesive 60.

As described above, in the semiconductor detector 400 according to the present second embodiment, since the underfill is not injected into the gap between the semiconductor chip CHP1 and the semiconductor chip CHP2, the increase of the parasitic capacitance due to the underfill can be suppressed. And, even without the usage of the underfill, the reduction of the connection strength between the semiconductor chip CHP1 and the semiconductor chip CHP2 can be suppressed by the devisal of the fixation of the semiconductor chip CHP2 at the inside of the opening OP2 formed in the wiring board WB by the adhesive 60. Therefore, it can be said that the semiconductor detector 400 according to the present second embodiment is superior in terms of achievement of both the suppression of the increase of the parasitic capacitance and the suppression of the reduction of the connection strength between the semiconductor chip CHP1 and the semiconductor chip CHP2.

<Verification of Effect>

Finally, explanation will be made about the improvement of the sensitivity of the semiconductor detector to the measurement of the X-ray energy as a result of the achievement of the less noises contained in the signal than, for example, those of the first and second related arts according to the first and second embodiments.

FIG. 16 is a diagram for explaining a verification result.

In FIG. 16, the first related art describes a "wire-bonding connection structure" in which the reading electrode and the gate terminal are connected to each other by the wire. In this first related art, a "Mn-Ka half width (eV)" is 130 to 135.

Here, the "Mn-Ka half width (eV)" indicates a half width of a peak of a Kα radiation (5890 eV) of manganese (Mn). The more the noises are, the larger the half width is. Therefore, the smaller the "Mn-Ka half width (eV)" is, the higher the measurement sensitivity is, and the better its performance is.

Next, the second related art describes a "flip-chip connection structure" in which the reading electrode pad and the gate terminal are connected to each other by the bump electrode. However, in this second related art, the underfill is injected into the gap between the first semiconductor chip having the reading electrode pad formed therein and the second semiconductor chip having the gate terminal formed therein. As a result, by the usage of the bump electrode instead of the wire, the influence of the parasitic capacitance and the parasitic inductance of the wire itself is removed. However, in the second related art, the "Mn-Ka half width (eV)" is larger than that of the first related art because of the parasitic capacitance due to the underfill having the high permittivity.

On the other hand, in the first embodiment (first specific aspect) based on the "flip-chip connection structure", the guide portion is formed in the region closer to the reading electrode. As a result, the "first connection structure" between the reading electrode pad and the gate terminal through the bump electrode is not covered with the underfill but surrounded by the space. In this first embodiment (first specific aspect), the "Mn-Ka half width (eV)" is 127 to 132. This means that the first embodiment (first specific aspect) reduces the influence of the parasitic capacitance due to the underfill and reduces the noises contained in the signal. Therefore, it can be found that the first embodiment (first specific aspect) can more improve the sensitivity of the semiconductor detector to the measurement of the X-ray energy than those of the first and second related arts.

Subsequently, in the first embodiment (third specific aspect) based on the "flip-chip connection structure", the guide portion is formed in the region closer to the reading electrode, and besides, the guide portion is also formed in the region closer to the output terminal. As a result, not only the "first connection structure" between the reading electrode pad and the gate terminal through the bump electrode but also the "second connection structure" between the output electrode pad and the output terminal through the bump electrode are not covered with the underfill but surrounded by the space. In this first embodiment (third specific aspect), the "Mn-Ka half width (eV)" is 126 to 131. This means that not only the reduction of the parasitic capacitance due to the "first connection structure" but also the reduction of the parasitic capacitance due to the "second connection structure" effectively affect the reduction of the noises. Therefore, it can be found that the first embodiment (third specific aspect) can also more improve the sensitivity of the semiconductor detector to the measurement of the X-ray energy than those of the first and second related arts.

Next, in the second embodiment based on the "flip-chip connection structure", the underfill does not intervene between the first semiconductor chip having the reading electrode pad and the output electrode pad formed therein and the second semiconductor chip having the gate terminal and the output terminal formed therein. As a result, even in the second embodiment, the "first connection structure" and the "second connection structure" are not covered with the underfill but surrounded by the space. In this second embodiment, the "Mn-Ka half width (eV)" is 127 to 132. Therefore, it can be found that the second embodiment can also more improve the sensitivity of the semiconductor detector to the measurement of the X-ray energy than those of the first and second related arts.

As described above, according to the first and second embodiments, the noises contained in the signal can be made less than those of the first and second related arts. As a result, the improvement of the sensitivity of the semiconductor detector to the measurement of the X-ray energy can be confirmed.

In the foregoing, the invention made by the present inventors has been concretely described on the basis of the embodiments. However, it is needless to say that the present invention is not limited to the foregoing embodiments and various modifications can be made within the scope of the present invention.

The embodiments include the following aspect.

(First Statement)

In a semiconductor detector measuring energy of electromagnetic wave on the basis of an electric charge amount of electric charge carriers being generated by making incidence of the electromagnetic wave into a depletion layer applied with a drift electric field, the electric charge carriers being moved to and collected in a reading electrode by the drift electric field, the semiconductor detector includes: a first semiconductor chip that has the reading electrode and a reading electrode pad electrically connected to the reading electrode formed therein; a wiring board that is connected to the first semiconductor chip in a flip-chip connection state and that has an opening; and a second semiconductor chip that has an amplifier electrically connected to the reading electrode pad, that is arranged inside the opening and that is connected to the first semiconductor chip in a flip-chip connection state. The second semiconductor chip is fixed at inside of the opening by an adhesive, and an underfill does not intervene between the second semiconductor chip and the first semiconductor chip including a first connection portion connecting the reading electrode pad and the amplifier.

What is claimed is:

1. A semiconductor detector measuring energy of electromagnetic wave on the basis of an electric charge amount of electric charge carriers being generated by making incidence of the electromagnetic wave into a depletion layer applied with a drift electric field, the electric charge carriers being moved to and collected in a reading electrode by the drift electric field, the semiconductor detector comprising:

a first semiconductor chip having the reading electrode and a reading electrode pad electrically connected to the reading electrode formed therein; and a second semiconductor chip having an amplifier electrically connected to the reading electrode pad, the second semiconductor chip being connected to the first semiconductor chip in a flip-chip connection state, wherein an underfill is injected into a gap between the first semiconductor chip and the second semiconductor chip except for a first connection portion connecting the reading electrode pad and the amplifier, wherein the amplifier includes a field effect transistor having a gate electrode, wherein the second semiconductor chip has a gate terminal electrically connected to the gate electrode, wherein the first connection portion is made of a first connection structure connecting the reading electrode pad and the gate terminal through a bump electrode, and wherein a first guide portion configured to suppress the first connection structure from being surrounded by the underfill is formed in the first semiconductor chip.

2. The semiconductor detector according to claim 1, wherein the first connection portion is surrounded by a space having a lower permittivity than a permittivity of the underfill.

3. The semiconductor detector according to claim 1, wherein the first guide portion is made of:
a pad portion; and
a protruding portion formed on the pad portion.

4. The semiconductor detector according to claim 3, wherein the protruding portion is made of the same material as a material of the bump electrode.

5. The semiconductor detector according to claim 1, wherein the first guide portion is made of an insulating material.

6. The semiconductor detector according to claim 1, wherein the first semiconductor chip configures a silicon drift detector.

7. The semiconductor detector according to claim 1, wherein the electromagnetic wave is X ray.

8. The semiconductor detector according to claim 1, wherein the reading electrode is an anode electrode, and the electric charge carriers are electrons.

9. A semiconductor detector measuring energy of electromagnetic wave on the basis of an electric charge amount of electric charge carriers being generated by making incidence of the electromagnetic wave into a depletion layer applied with a drift electric field, the electric charge carriers being moved to and collected in a reading electrode by the drift electric field, the semiconductor detector comprising:

a first semiconductor chip having the reading electrode and a reading electrode pad electrically connected to the reading electrode formed therein; and a second semiconductor chip having an amplifier electrically connected to the reading electrode pad, the second semiconductor chip being connected to the first semiconductor chip in a flip-chip connection state, wherein an underfill is injected into a gap between the first semiconductor chip and the second semiconductor chip except for a first connection portion connecting the reading electrode pad and the amplifier, wherein the second semiconductor chip has an output terminal that outputs an amplified signal that is amplified by the amplifier, wherein the first semiconductor chip has an output electrode pad electrically connected to the output terminal, wherein the underfill is injected into a gap between the first semiconductor chip and the second semiconductor chip except for not only the first connection portion connecting the reading electrode pad and the amplifier but also a second connection portion connecting the output electrode pad and the output terminal, wherein the second connection portion is made of a second connection structure connecting the output electrode pad and the output terminal through a bump electrode, and wherein a second guide portion configured to suppress the second connection structure from being surrounded by the underfill is formed in the first semiconductor chip.

10. The semiconductor detector according to claim 9, wherein the second connection portion is also surrounded by a space having a lower permittivity than a permittivity of the underfill.

11. A method of manufacturing a semiconductor detector measuring energy of electromagnetic wave on the basis of an electric charge amount of electric charge carriers being generated by making incidence of the electromagnetic wave into a depletion layer applied with a drift electric field, the electric charge carriers being moved to and collected in a reading electrode by the drift electric field, the method comprising the steps of:

(a) preparing a first semiconductor chip having the reading electrode and a reading electrode pad electrically connected to the reading electrode formed therein;

(b) preparing a second semiconductor chip having an amplifier;

(c) connecting the first semiconductor chip and the second semiconductor chip in a flip-chip connection state so that the reading electrode pad and the amplifier are electrically connected to each other; and (d) injecting an underfill into a gap between the first semiconductor chip and the second semiconductor chip except for a first connection portion connecting the reading electrode pad and the amplifier, wherein the first connection portion is made of a first connection structure connecting the reading electrode pad and the gate terminal through a bump electrode, and (e) suppressing the first connection structure from being surrounded by the underfill by using a guide portion formed in the first semiconductor chip.

* * * * *